United States Patent
Hsiang et al.

(10) Patent No.: US 10,665,764 B2
(45) Date of Patent: May 26, 2020

(54) MICRO LIGHTING DEVICE

(71) Applicant: ACER INCORPORATED, New Taipei (TW)

(72) Inventors: Jui-Chieh Hsiang, New Taipei (TW); Chih-Chiang Chen, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 0 days.

(21) Appl. No.: 15/925,754

(22) Filed: Mar. 19, 2018

(65) Prior Publication Data
US 2019/0189873 A1  Jun. 20, 2019

(30) Foreign Application Priority Data

Dec. 19, 2017  (TW) .............................. 106144546 A

(51) Int. Cl.
| | |
|---|---|
| *H01L 33/62* | (2010.01) |
| *H01L 29/786* | (2006.01) |
| *H01L 33/60* | (2010.01) |
| *H01L 29/06* | (2006.01) |
| *H01L 27/15* | (2006.01) |
| *H01L 33/06* | (2010.01) |
| *H01L 33/36* | (2010.01) |
| *H01L 25/16* | (2006.01) |

(52) U.S. Cl.
CPC ............ *H01L 33/60* (2013.01); *H01L 25/167* (2013.01); *H01L 27/15* (2013.01); *H01L 29/0649* (2013.01); *H01L 33/06* (2013.01); *H01L 33/36* (2013.01); *H01L 33/62* (2013.01); *H01L 29/786* (2013.01)

(58) Field of Classification Search
CPC ... H01L 27/124; H01L 25/0753; H01L 33/20; H01L 27/156; H01L 33/42; H01L 33/62; H01L 24/95; G09G 3/32
See application file for complete search history.

(56) References Cited

U.S. PATENT DOCUMENTS

| | | | |
|---|---|---|---|
| 6,410,942 B1 | 6/2002 | Thibeault | |
| 8,558,243 B2 | 10/2013 | Bibl | |
| 9,178,123 B2 | 11/2015 | Sakariya | |
| 9,472,734 B1* | 10/2016 | Chen | ...................... H01L 33/505 |
| 9,806,127 B1* | 10/2017 | Ahmed | ................. H01L 27/156 |
| 2014/0159043 A1* | 6/2014 | Sakariya | ............... H01L 27/124 |
| | | | 257/59 |
| 2016/0181476 A1 | 6/2016 | Chang | |

(Continued)

FOREIGN PATENT DOCUMENTS

| | | |
|---|---|---|
| CN | 101132036 A | 2/2008 |
| CN | 101425554 A | 5/2009 |

(Continued)

*Primary Examiner* — Mary A Wilczewski
*Assistant Examiner* — Tsz K Chiu
(74) *Attorney, Agent, or Firm* — Winston Hsu

(57) ABSTRACT

A micro lighting device includes a substrate, an isolation layer formed on the substrate, a side-emission micro device, and a switching device. The side-emission micro device includes a first electrode, a second electrode and an emission surface. The side-emission micro device is disposed in a way so that the emission surface is perpendicular or parallel to the surface of the substrate. The switching device includes a first end, a second end coupled to the first electrode, and a control end.

15 Claims, 4 Drawing Sheets

(56) References Cited

U.S. PATENT DOCUMENTS

2017/0243773 A1    8/2017   Hwang
2018/0261785 A1*   9/2018   Ahmed ............... H01L 51/5265

FOREIGN PATENT DOCUMENTS

| | | |
|---|---|---|
| CN | 104838508 A | 8/2015 |
| CN | 205920990 U | 2/2017 |
| CN | 205992385 U | 3/2017 |
| CN | 106848026 A | 6/2017 |
| KR | 10-2012-0107383 A | 10/2012 |
| TW | 201507212 A | 2/2015 |

\* cited by examiner

MICRO LIGHTING DEVICE

CROSS REFERENCE TO RELATED APPLICATION

This application claims priority of Taiwan Application No. 106144546 filed on 2017 Dec. 19.

BACKGROUND OF THE INVENTION

1. Field of the Invention

The present invention is related to a micro lighting device, and more particularly, to a micro lighting device which adopts side-emission micro devices.

2. Description of the Prior Art

Compared to traditional incandescent bulbs, light-emitting diodes (LEDs) are advantageous in low power consumption, long lifetime, small size, no warm-up time, fast reaction speed, and the ability to be manufactured as small or array devices. In addition to outdoor displays, traffic signs, and liquid crystal display (LCD) backlight for various electronic devices such as mobile phones, notebook computers or personal digital assistants (PDAs), LEDs are also widely used as indoor/outdoor lighting devices in place of fluorescent of incandescent lamps. An LED may adopt front-emission micro devices or side-emission micro devices. Front-emission micro devices provide wider viewing angles, but have poor performances in emission efficiency and half wavelength. Side-emission micro devices excel in high emission efficiency and better half wavelength, but can only provide narrower viewing angles.

The size of traditional LED arrays is the dimension of millimeters (mm). The size of micro LED arrays may be reduced to the dimension of micrometers (μm) while inheriting the same good performances regarding power consumption, brightness, resolution, color saturation, reaction speed, life time and efficiency. In a micro LED manufacturing process, a thin-film, miniaturized and array design is adopted so that multiple micro LEDs are fabricated in the dimension of merely 1-250 μm. Next, these micro LEDs are mass transferred to be disposed on another circuit board. Protection layers and upper electrodes may be formed in a physical deposition process before packaging the upper substrate.

Traditional micro LEDs normally adopt front-emission micro devices with low emission efficiency. Therefore, there is a need for micro devices with wide viewing angles and high emission efficiency.

SUMMARY OF THE INVENTION

The present invention provides a micro lighting device which includes a substrate, an isolation layer formed on the substrate, a side-emission micro device, and a switching device. The side-emission micro device includes a first electrode, a second electrode and an emission surface, wherein the side-emission micro device is disposed in a way so that the emission surface is perpendicular to a surface of the substrate. The switching device includes a first end, a second end coupled to the first electrode, and a control end.

The present invention also provides a micro lighting device which includes a substrate, an isolation layer formed on the substrate, a side-emission micro device, a switching device, and at least one peripheral structure. The side-emission micro device includes a first electrode, a second electrode and an emission surface, wherein the side-emission micro device is disposed in a way so that the emission surface is parallel to a surface of the substrate. The switching device includes a first end, a second end coupled to the first electrode, and a control end. The at least one peripheral structure is covered by a reflective layer and includes a plurality of surfaces each at a specific angle with respect to the emission surface for adjusting a path of a beam emitted by the side-emission micro device.

The present invention also provides a micro lighting device which includes a substrate, an isolation layer formed on the first substrate, a side-emission micro device, a switching device, a first dielectric layer, and a second dielectric layer. The side-emission micro device includes a first electrode, a second electrode and an emission surface, wherein the side-emission micro device is disposed in a way so that the emission surface is parallel to a surface of the substrate. The switching device includes a first end, a second end coupled to the first electrode, and a control end. The first dielectric layer has a first refractive index. The second dielectric layer has a second refractive index different from the first refractive index so that a total reflection critical condition is satisfied when a beam emitted by the side-emission micro device arrives at the second dielectric layer after passing the first dielectric layer.

These and other objectives of the present invention will no doubt become obvious to those of ordinary skill in the art after reading the following detailed description of the preferred embodiment that is illustrated in the various figures and drawings.

DETAILED DESCRIPTION

Figures 1, 2:
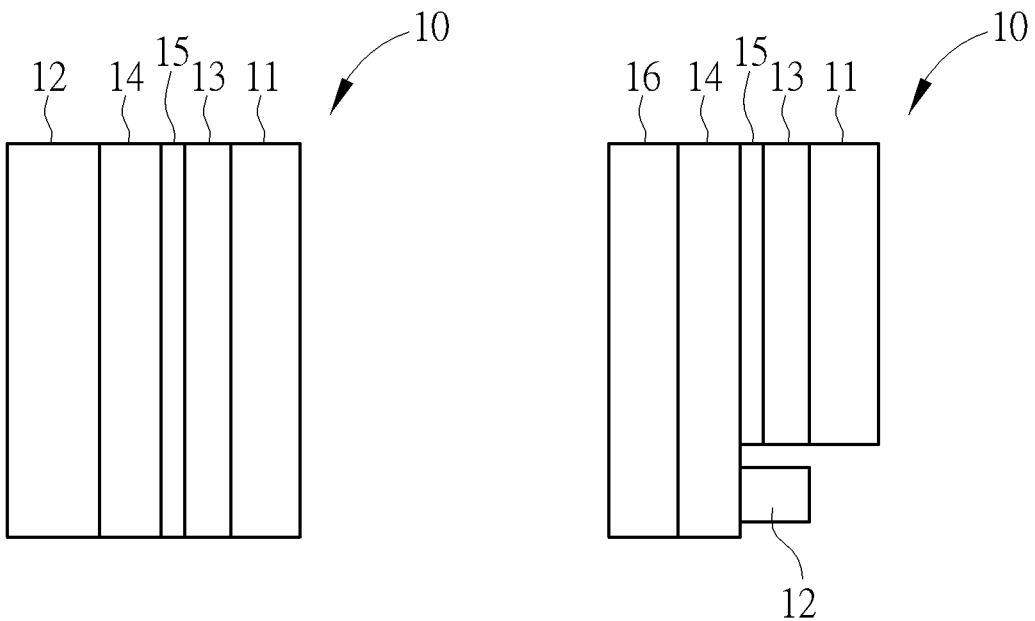
FIG. 1 is a structural diagram illustrating a side-emission micro device according to an embodiment of the present invention.
FIG. 2 is a structural diagram illustrating a side-emission micro device according to another embodiment of the present invention.
Figure 3:
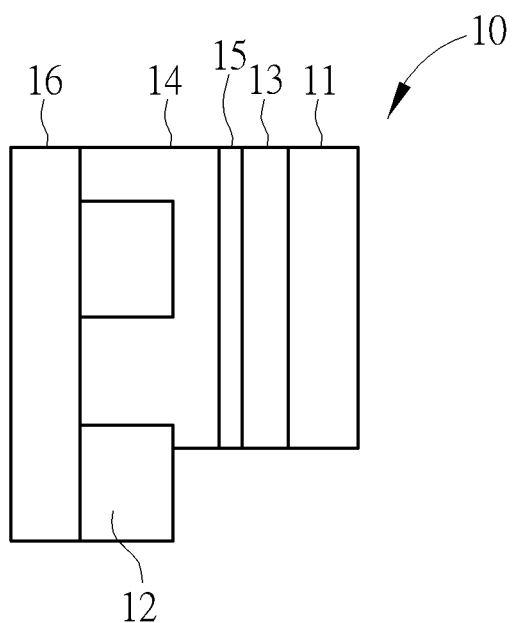
FIG. 3 is a structural diagram illustrating a side-emission micro device according to another embodiment of the present invention.

FIGS. 1~3 are structural diagrams illustrating a side-emission micro device 10 according to embodiments of the present invention. In the present invention, the side-emission micro device 10 may be a micro LED device which is fabricated by combining P-type and N-type semiconductor materials before being mass transferred to a substrate (not shown).

In the embodiment illustrated in FIG. 1, the side-emission micro device 10 includes a first metal layer 11, a second metal layer 12, a first semiconductor layer 13, a second semiconductor layer 14, and a luminescent layer 15. The first metal layer 11 may serve as a P-electrode, and the second metal layer 12 may serve as an N-electrode. The first semiconductor layer 13 may include P-type dopants, and the second semiconductor layer 14 may include N-type dopants. The luminescent layer 15 may be fabricated as an active layer with a multiple-quantum-well (MQW) structure whose wavelength is determined by the material band-gap. The luminescent layer 15 is formed between the first semiconductor layer 13 and the second semiconductor layer 14. When a positive voltage is applied to the first metal layer 11 and a negative voltage is applied to the second metal layer 12, electrons flow from the N-region towards the P-region and holes flow from the P-region towards the N-region due to the forward-bias voltage. These electrons and holes then combine in the PN junction of the luminescent layer 15, thereby emitting photons of light.

In the embodiment illustrated in FIG. 2, the side-emission micro device 10 includes a first metal layer 11, a second metal layer 12, a first semiconductor layer 13, a second semiconductor layer 14, a luminescent layer 15, and a substrate 16. The first metal layer 11 may serve as a P-electrode, and the second metal layer 12 may serve as an N-electrode. The first semiconductor layer 13 may include P-type dopants, and the second semiconductor layer 14 may include N-type dopants. The luminescent layer 15 may be fabricated as an active layer with an MQW structure whose wavelength is determined by the material band-gap. The substrate 16 may be a sapphire substrate, a Silicon Carbide (SiC) substrate, or a metal substrate. The second semiconductor layer 14 is formed on the substrate 16. The luminescent layer 15 and the second metal layer 12 are formed on the second semiconductor layer 14. The first semiconductor layer 13 is formed on the luminescent layer 15. The first metal layer 11 is formed on the first semiconductor layer 13. When a positive voltage is applied to the first metal layer 11 and a negative voltage is applied to the second metal layer 12, electrons flow from the N-region towards the P-region and holes flow from the P-region towards the N-region due to the forward-bias voltage. These electrons and holes then combine in the PN junction of the luminescent layer 15, thereby emitting photons of light.

In the embodiment illustrated in FIG. 3, the side-emission micro device 10 includes a first metal layer 11, a second metal layer 12, a first semiconductor layer 13, a second semiconductor layer 14, a luminescent layer 15, and a substrate 16. The first metal layer 11 may serve as a P-electrode, and the second metal layer 12 may serve as an N-electrode. The first semiconductor layer 13 may include P-type dopants, and the second semiconductor layer 14 may include N-type dopants. The luminescent layer 15 may be fabricated as an active layer with an MQW structure whose wavelength is determined by the material band-gap. The substrate 16 may be a sapphire substrate, a Silicon Carbide substrate, or a metal substrate. The second metal layer 12 is formed on the substrate 16. The second semiconductor layer 14 is formed on the substrate 16 and the second metal layer 12. The luminescent layer 15 is formed on the second semiconductor layer 14. The first semiconductor layer 13 is formed on the luminescent layer 15. The first metal layer 11 is formed on the first semiconductor layer 13. When a positive voltage is applied to the first metal layer 11 and a negative voltage is applied to the second metal layer 12, electrons flow from the N-region towards the P-region and holes flow from the P-region towards the N-region due to the forward-bias voltage. These electrons and holes then combine in the PN junction of the luminescent layer 15, thereby emitting photons of light.

Figure 4:
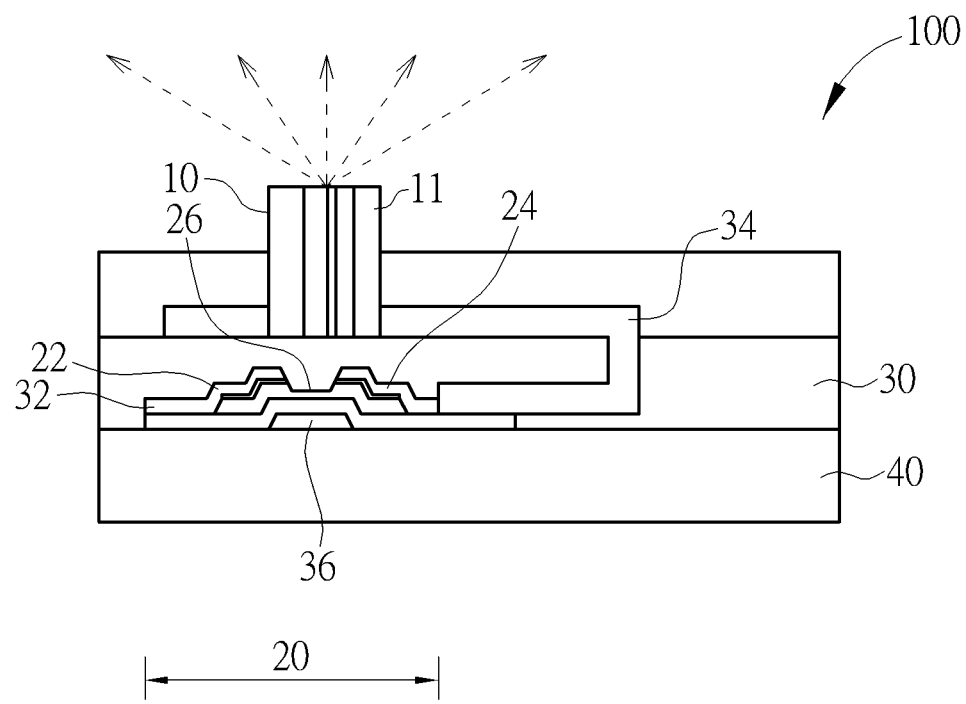
FIG. 4 is a structural diagram illustrating a micro lighting device according to an embodiment of the present invention.
Figure 5:
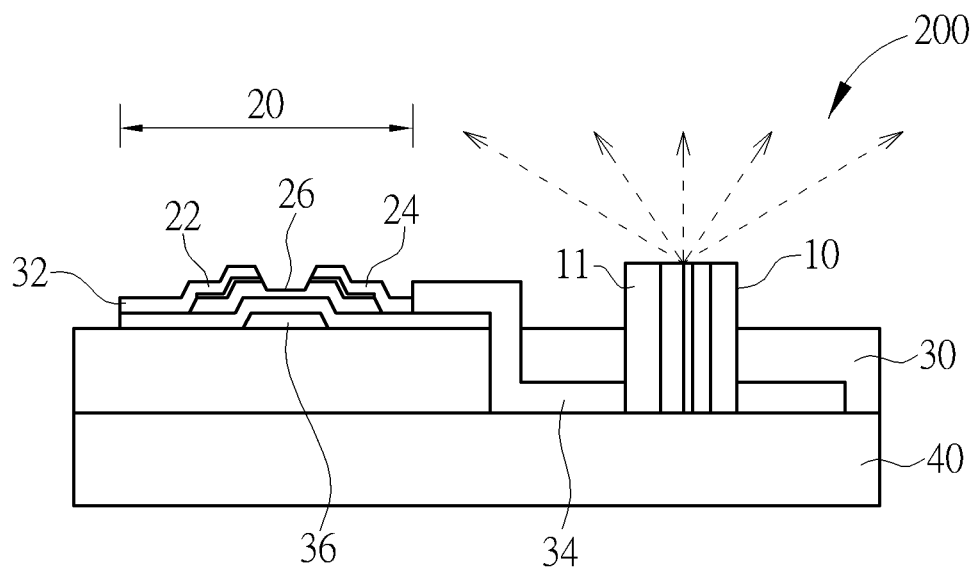
FIG. 5 is a structural diagram illustrating a micro lighting device according to another embodiment of the present invention.

FIG. 4 is a structural diagram illustrating a micro lighting device 100 according to an embodiment of the present invention. FIG. 5 is a structural diagram illustrating a micro lighting device 200 according to another embodiment of the present invention. The micro lighting devices 100 and 200 with a thin-film, miniaturized and array design each include a plurality of side-emission micro devices, a plurality of switching devices, an isolation layer 30, and a substrate 40. For illustrative purpose, FIG. 4 and FIG. 5 only depict a single side-emission micro device 10 in FIG. 1 and a single switching device 20. However, the micro lighting devices 100 and 200 may also adopt the side-emission micro device 10 depicted in FIG. 2 and FIG. 3. The side-emission micro device 10, the switching device 20 and the isolation layer 30 are disposed or formed on the substrate 40, wherein the side-emission micro device is disposed in a way so that its main emission surface (larger than a emission ratio of 50%) is perpendicular to the surface of isolation layer 30 and the substrate 40 (growth direction), as indicated by the dotted arrows. The switching device 20 is a three-terminal device which includes a first end 22 coupled to a data line 32, a second end 24 coupled to the P-electrode (the first metal layer 11) of the side-emission micro device 10 via a drain line 34, and a control end 26 coupled to a scan line 36.

In the embodiment illustrated in FIG. 4, the micro lighting devices 100 adopts a lower-switch structure in which the switching device 20 is formed on the substrate 40 and the side-emission micro device 10 is formed on the higher isolation layer 30. In the embodiment illustrated in FIG. 5, the micro lighting devices 200 adopts an upper-switch structure in which the side-emission micro device 10 is formed on the substrate 40 and the switching device 20 is formed on the higher isolation layer 30.

Figure 6:
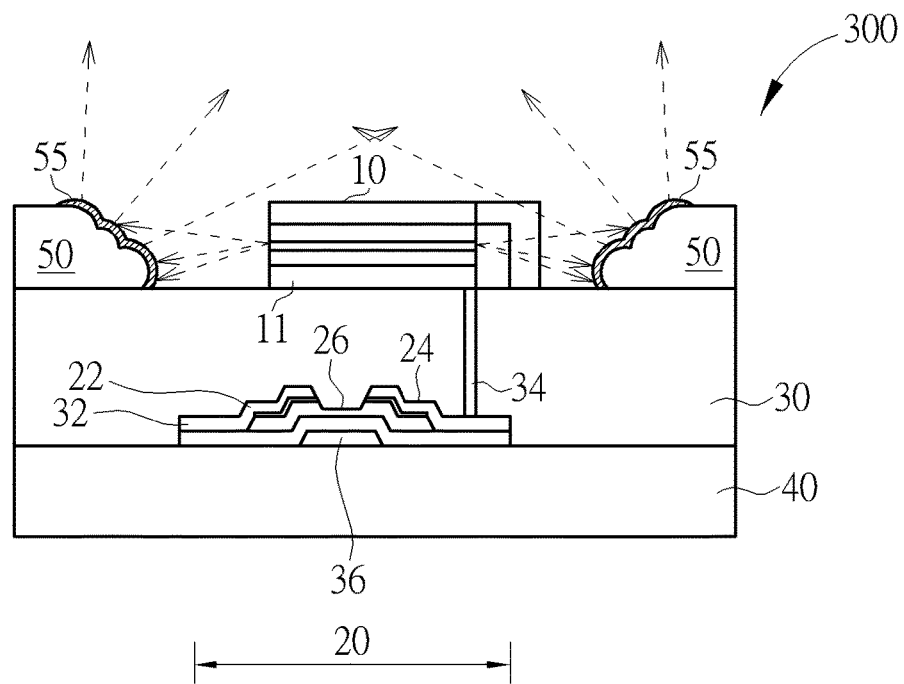
FIG. 6 is a structural diagram illustrating a micro lighting device according to another embodiment of the present invention.

FIG. 6 is a structural diagram illustrating a micro lighting device 300 according to another embodiment of the present invention. FIG. 6 is a structural diagram illustrating a micro lighting device 400 according to another embodiment of the present invention. The micro lighting devices 300 and 400 with a thin-film, miniaturized and array design each include a plurality of side-emission micro devices, a plurality of switching devices, an isolation layer 30, a substrate 40, and peripheral structures 50. For illustrative purpose, FIG. 6 and FIG. 7 only depict a single side-emission micro device 10 in FIG. 1 and a single switching device 20. However, the micro lighting devices 300 and 400 may also adopt the side-emission micro device 10 depicted in FIG. 2 and FIG. 3. The peripheral structures 50 include isolating materials and are covered by a reflective layer 55. The side-emission micro device 10, the switching device 20, the isolation layer 30 and the peripheral structures 50 are disposed or formed on the substrate 40, wherein the side-emission micro device 10 is disposed in a way so that its main emission surface (larger than an emission ratio of 50%) is parallel to the surface of isolation layer 30 and the substrate 40 (growth direction), as indicated by the dotted arrows. The switching device 20 is a three-terminal device which includes a first end 22 coupled to a data line 32, a second end 24 coupled to the P-electrode (the first metal layer 11) of the side-emission micro device 10 via a drain line 34, and a control end 26 coupled to a scan line 36.

In the embodiment illustrated in FIG. 6, the micro lighting devices 300 adopts a lower-switch structure in which the switching device 20 is formed on the substrate 40, while the side-emission micro device 10 and the peripheral structures 50 are formed on the higher isolation layer 30. The peripheral structures 50 include a plurality of surfaces each at a specific angle with respect to the surface of the isolation layer 30, thereby capable of adjusting the paths of the beams emitted from the main emission surface of the side-emission micro device 10, as indicated by the dotted arrows.

Figure 7:
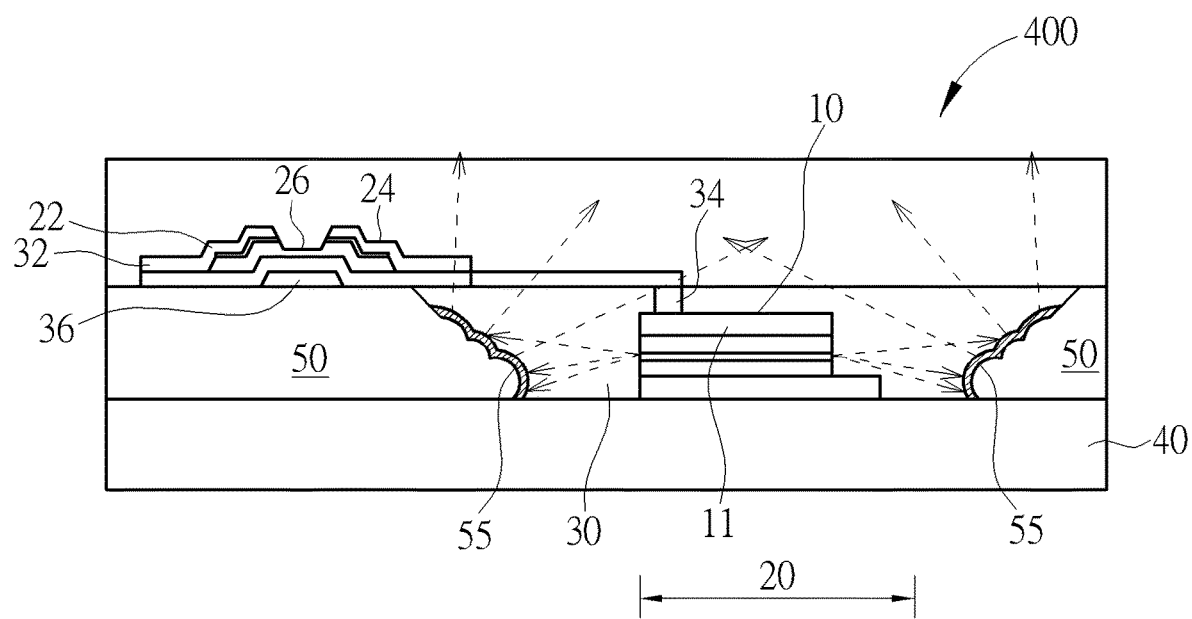
FIG. 7 is a structural diagram illustrating a micro lighting device according to another embodiment of the present invention.

In the embodiment illustrated in FIG. 7, the micro lighting devices 400 adopts an upper-switch structure in which the switching device 20 and the peripheral structures 50 are formed on the substrate 40, while the side-emission micro device 10 is formed on the higher isolation layer 30. The peripheral structures 50 include a plurality of surfaces each at a specific angle with respect to the surface of the substrate 40, thereby capable of adjusting the paths of the beams emitted from the main emission surface of the side-emission micro device 10, as indicated by the dotted arrows.

Figure 8:
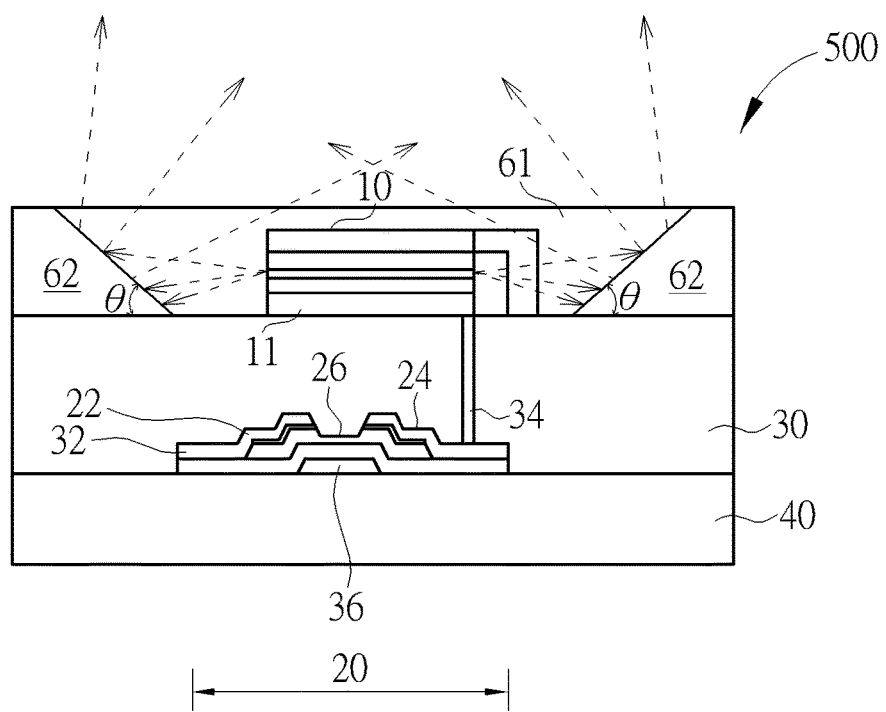
FIG. 8 is a structural diagram illustrating a micro lighting device according to another embodiment of the present invention.
Figure 9:
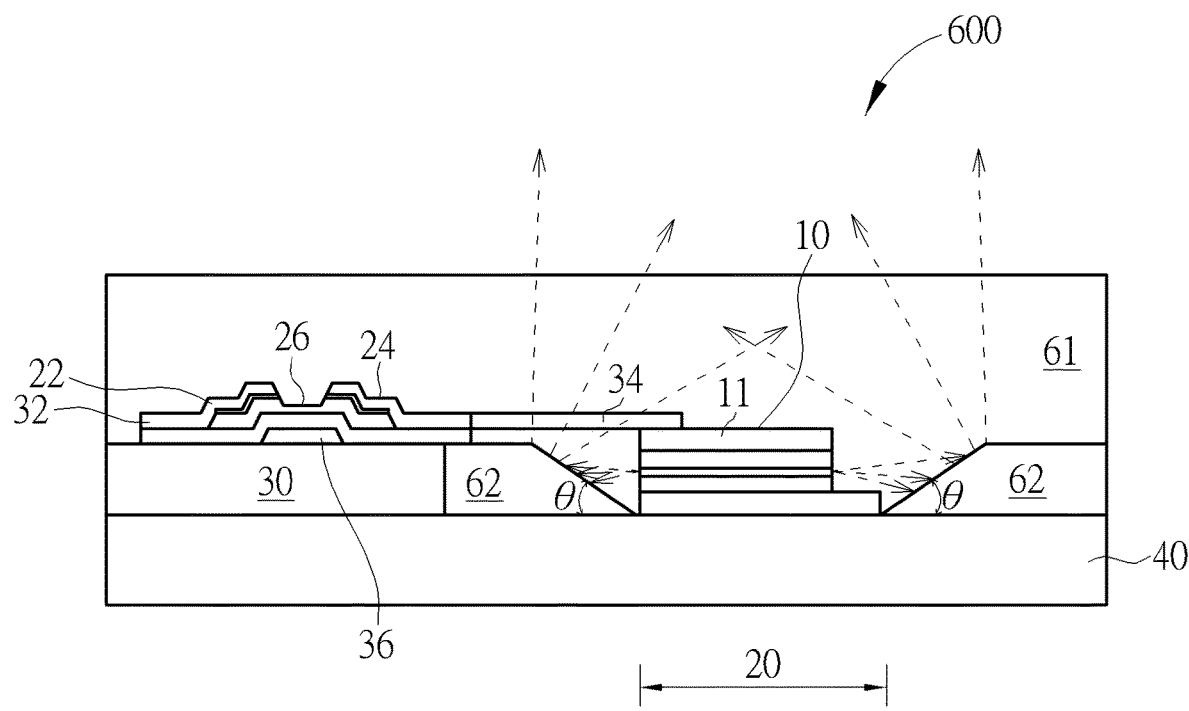
FIG. 9 is a structural diagram illustrating a micro lighting device according to another embodiment of the present invention.

FIG. 8 is a structural diagram illustrating a micro lighting device 500 according to another embodiment of the present invention. FIG. 9 is a structural diagram illustrating a micro lighting device 600 according to another embodiment of the present invention. The micro lighting devices 500 and 600 with a thin-film, miniaturized and array design each include a plurality of side-emission micro devices, a plurality of switching devices, an isolation layer 30, a substrate 40, a first dielectric layer 61 and a second dielectric layer 62. For illustrative purpose, FIG. 8 and FIG. 9 only depict a single side-emission micro device 10 in FIG. 1 and a single switching device 20. However, the micro lighting devices 500 and 600 may also adopt the side-emission micro device 10 depicted in FIG. 2 and FIG. 3. The side-emission micro device 10, the switching device 20, the isolation layer 30, the first dielectric layer 61 and the second dielectric layer 62 are disposed or formed on the substrate 40, wherein the side-emission micro device 10 is disposed in a way so that its main emission surface (larger than an emission ratio of 50%) is parallel to the surface of isolation layer 30 and the substrate 40 (growth direction), as indicated by the dotted arrows. The switching device 20 is a three-terminal device which includes a first end 22 coupled to a data line 32, a second end 24 coupled to the P-electrode (the first metal layer 11) of the side-emission micro device 10 via a drain line 34, and a control end 26 coupled to a scan line 36.

In the embodiment illustrated in FIG. 8, the micro lighting devices 500 adopts a lower-switch structure in which the switching device 20 is formed on the substrate 40, while the side-emission micro device 10, the first dielectric layer 61 and the second dielectric layer 62 are formed on the higher isolation layer 30. The first dielectric layer 61 and the second dielectric layer 62 have different dielectric constants, and the surface of the second dielectric layer 62 is at a specific angle θ with respect to the surface of the isolation layer 30. Therefore, the first dielectric layer 61 and the second dielectric layer 62 may provide different refractive indexes, thereby capable of adjusting the paths of the beams emitted from the main emission surface of the side-emission micro device 10, as indicated by the dotted arrows.

In the embodiment illustrated in FIG. 9, the micro lighting devices 600 adopts an upper-switch structure in which the side-emission micro device 10, the first dielectric layer 61 and the second dielectric layer 62 are formed on the substrate 40, while the switching device 20 is formed on the higher isolation layer 30. The first dielectric layer 61 and the second dielectric layer 62 have different dielectric constants, and the surface of the second dielectric layer 62 is at a specific angle θ with respect to the surface of the isolation layer 30. Therefore, the first dielectric layer 61 and the second dielectric layer 62 may provide different refractive indexes, thereby capable of adjusting the paths of the beams emitted from the main emission surface of the side-emission micro device 10, as indicated by the dotted arrows.

In the embodiments illustrated in FIG. 8 and FIG. 9, the dielectric constant n1 of the first dielectric layer 61 and the dielectric constant n2 of the second dielectric layer 62 may be designed according to Snell's law in order to satisfy the total reflection critical condition. More specifically, assuming that $\theta 1$ is the incident angle of light when arriving the second dielectric layer 62 from the first dielectric layer 61 and $\theta 2$ is the refraction angle of light after entering the second dielectric layer 62, then $n1*\sin(\theta 1)=n2*\sin(\theta 2)$ and the critical angle $\theta c$ of total reflection is $\sin^{-1}(n2/n1)$. Therefore, the present invention may determine the dielectric constant n1 of the first dielectric layer 61 and the dielectric constant n2 of the second dielectric layer 62, and then adjust the specific angle θ according the refractive indexes of the first dielectric layer 61 and the second dielectric layer 62. This way, the beam emitted by the side-emission micro device 10 may enter the second dielectric layer 62 from the first dielectric layer 61 with an incident angle larger than the critical angle $\theta c$ of total reflection, thereby capable of adjusting the paths of the beams, as indicated by the dotted arrows.

In conclusion, the present invention provides a micro lighting device with side-emission micro devices. In addition to good performances regarding power consumption, brightness, resolution, color saturation, reaction speed, life time and efficiency, the present micro lighting device can also provide wide viewing angles and high emission efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A micro lighting device, comprising:
   a first substrate;
   an isolation layer formed on the first substrate;
   a side-emission micro device including:
      a first metal layer for serving as a first electrode;
      a second metal layer for serving as a second electrode;
      a first semiconductor layer;
      a second semiconductor layer;
      a luminescent layer; and
      a second substrate;
   wherein:
      a first doping type of the first semiconductor layer is different from a second doping type of the second semiconductor layer;
      the second semiconductor layer is directly formed on the second substrate;
      the luminescent layer and the second metal layer are directly formed on a same side of the second semiconductor layer;
      the first semiconductor layer is directly formed on the luminescent layer;
      the first metal layer is directly formed on the first semiconductor layer; and
      the side-emission micro device is disposed in a way so that a growth direction of the first metal layer, the first semiconductor layer, the luminescent layer, the second metal layer, the second semiconductor layer is perpendicular to a growth direction of forming the isolation layer on the first substrate; and a switching device including a first end, a second end coupled to the first electrode, and a control end.

2. The micro lighting device of claim 1, wherein the side-emission micro device is formed on the isolation layer and the switching device is formed on the first substrate.

3. The micro lighting device of claim 1, wherein the side-emission micro device is formed on the first substrate and the switching device is formed on the isolation layer.

4. A micro lighting device, comprising:
a first substrate;
an isolation layer formed on the first substrate;
a side-emission micro device including a first electrode, a second electrode, a first emission surface, and a second emission surface, wherein the first emission surface has an emission ratio larger than 50% and the side-emission micro device is disposed in a way so that the first emission surface is parallel to a growth direction of forming the isolation layer on the first substrate and the second emission surface is perpendicular to the growth direction of forming the isolation layer on the first substrate;
a switching device including a first end, a second end coupled to the first electrode, and a control end; and
at least one peripheral structure covered by a reflective layer and including a plurality of surfaces each at a specific angle with respect to the first emission surface for adjusting a path of a beam emitted by the side-emission micro device from the first emission surface.

5. The micro lighting device of claim 4, wherein the side-emission micro device is formed on the isolation layer and the switching device is formed on the first substrate.

6. The micro lighting device of claim 4, wherein the side-emission micro device is formed on the first substrate and the switching device is formed on the isolation layer.

7. The micro lighting device of claim 4, wherein:
the side-emission micro device includes:
a first metal layer for serving as the first electrode;
a second metal layer for serving as the second electrode;
a first semiconductor layer;
a second semiconductor layer; and
a luminescent layer;
a first doping type of the first semiconductor layer is different from a second doping type of the second semiconductor layer;
the luminescent layer is formed between the first semiconductor layer and the second semiconductor layer; and
the luminescent layer, the first semiconductor layer and the second semiconductor layer are formed between the first metal layer and the second layer.

8. The micro lighting device of claim 4, wherein:
the side-emission micro device includes:
a first metal layer for serving as the first electrode;
a second metal layer for serving as the second electrode;
a first semiconductor layer;
a second semiconductor layer;
a luminescent layer; and
a second substrate;

a first doping type of the first semiconductor layer is different from a second doping type of the second semiconductor layer;
the second semiconductor layer is formed on the second substrate;
the luminescent layer and the second semiconductor layer are formed on the second semiconductor layer;
the first semiconductor layer is formed on the luminescent layer; and
the first metal layer is formed on the first semiconductor layer.

9. The micro lighting device of claim 4, wherein:
the side-emission micro device includes:
a first metal layer for serving as the first electrode;
a second metal layer for serving as the second electrode;
a first semiconductor layer;
a second semiconductor layer;
a luminescent layer; and
a second substrate;
a first doping type of the first semiconductor layer is different from a second doping type of the second semiconductor layer;
the second metal layer is formed on the second substrate;
the second semiconductor layer is formed on the second substrate and the second semiconductor layer;
the luminescent layer is formed on the second semiconductor layer;
the first semiconductor layer is formed on the luminescent layer; and
the first metal layer is formed on the first semiconductor layer.

10. A micro lighting device, comprising:
a first substrate;
an isolation layer formed on the first substrate;
a side-emission micro device including a first electrode, a second electrode and a main emission surface, wherein the main emission surface has an emission ratio larger than 50% and the side-emission micro device is disposed in a way so that the main emission surface is parallel to a growth direction of forming the isolation layer on the first substrate;
a switching device including a first end, a second end coupled to the first electrode, and a control end; and
a first dielectric layer having a first refractive index; and
a second dielectric layer having a second refractive index different from the first refractive index so that a total reflection critical condition is satisfied when a beam emitted by the side-emission micro device of the main emission surface arrives at the second dielectric layer after passing the first dielectric layer.

11. The micro lighting device of claim 10, wherein the side-emission micro device is formed on the isolation layer and the switching device is formed on the first substrate.

12. The micro lighting device of claim 10, wherein the side-emission micro device is formed on the first substrate and the switching device is formed on the isolation layer.

13. The micro lighting device of claim 10, wherein:
the side-emission micro device includes:
a first metal layer for serving as the first electrode;
a second metal layer for serving as the second electrode;
a first semiconductor layer;
a second semiconductor layer; and
a luminescent layer;

a first doping type of the first semiconductor layer is different from a second doping type of the second semiconductor layer;

the luminescent layer is formed between the first semiconductor layer and the second semiconductor layer; and the luminescent layer, the first semiconductor layer and the second semiconductor layer are formed between the first metal layer and the second layer.

14. The micro lighting device of claim 10, wherein:

the side-emission micro device includes:
- a first metal layer for serving as the first electrode;
- a second metal layer for serving as the second electrode;
- a first semiconductor layer;
- a second semiconductor layer;
- a luminescent layer; and
- a second substrate;

a first doping type of the first semiconductor layer is different from a second doping type of the second semiconductor layer;

the second semiconductor layer is formed on the second substrate;

the luminescent layer and the second semiconductor layer are formed on the second semiconductor layer;

the first semiconductor layer is formed on the luminescent layer; and the first metal layer is formed on the first semiconductor layer.

15. The micro lighting device of claim 10, wherein:

the side-emission micro device includes:
- a first metal layer for serving as the first electrode;
- a second metal layer for serving as the second electrode;
- a first semiconductor layer;
- a second semiconductor layer;
- a luminescent layer; and
- a second substrate;

a first doping type of the first semiconductor layer is different from a second doping type of the second semiconductor layer;

the second metal layer is formed on the second substrate;

the second semiconductor layer is formed on the second substrate and the second semiconductor layer;

the luminescent layer is formed on the second semiconductor layer;

the first semiconductor layer is formed on the luminescent layer; and the first metal layer is formed on the first semiconductor layer.

* * * * *